United States Patent
Kim et al.

(10) Patent No.: US 6,680,638 B2
(45) Date of Patent: Jan. 20, 2004

(54) HIGH-SPEED DISCHARGE-SUPPRESSED D FLIP-FLOP

(75) Inventors: Soo-Won Kim, Seoul (KR); Myoung-Su Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/228,870

(22) Filed: Aug. 26, 2002

(65) Prior Publication Data

US 2003/0062941 A1 Apr. 3, 2003

(30) Foreign Application Priority Data

Sep. 24, 2001 (KR) ........................................ 2001-59041

(51) Int. Cl.[7] .......................... H03K 3/037; H03K 3/12; H03K 3/286
(52) U.S. Cl. .................... 327/218; 327/208; 327/210
(58) Field of Search ................................ 327/199, 200, 327/201, 208–212, 218; 365/95–98

(56) References Cited

U.S. PATENT DOCUMENTS

| | | | |
|---|---|---|---|
| 5,592,114 A | 1/1997 | Wu et al. ................. 327/208 |
| 6,060,927 A | 5/2000 | Lee ........................... 327/218 |
| 6,448,831 B1 * | 9/2002 | Hunt et al. ............... 327/211 |
| 6,486,719 B2 * | 11/2002 | Kim ......................... 327/199 |

OTHER PUBLICATIONS

Huang, Qiuting, et al. "Speed Optimization of Edge–Triggered CMOS Circuits for Gigahertz Single–Phase Clocks," *IEEE Journal of Solid–State Circuits*, vol. 31, No. 3, Mar. 1996, pp. 456–465.

* cited by examiner

*Primary Examiner*—Tuan T. Lam
(74) *Attorney, Agent, or Firm*—Mills & Onello, LLP

(57) ABSTRACT

A high-speed D flip-flop includes first and second precharge circuits, and first to fifth switching circuits. The first precharge circuit precharges first and second internal nodes to a first supply voltage in response to a clock signal, and the first switching circuit provides a first discharge path between the first internal node and a third internal node in response to an input signal. The second switching circuit provides a second discharge path between the second and third internal nodes in response to a potential of the first internal node, and the second precharge circuit precharges an output terminal to a first supply voltage in response to a potential of the second internal node. The first switching circuit provides a third discharge path between the output terminal an the third internal node in response to the potential of the second internal node, and the fourth switching circuit connects the first to third discharge paths with a second supply voltage in response to the clock signal.

19 Claims, 12 Drawing Sheets

HIGH-SPEED DISCHARGE-SUPPRESSED D FLIP-FLOP

RELATED APPLICATION

This application relies for priority upon Korean Patent Application No. 2001-59041, filed on Sep. 24, 2001, the contents of which are herein incorporated by reference in their entirety.

FIELD OF THE INVENTION

The present invention generally relates to semiconductor integrated circuits. More particularly, the invention relates to a D flip-flop that is synchronized with a clock signal to have a memory function for storing an input signal or for outputting the stored signal.

BACKGROUND OF THE INVENTION

In recent years, the development of information and communication technologies has had a great effect on society and culture. Particularly, the rapid advancement of the Internet technologies, personal terminals, and portable computers requires processing of a large amount of information. This has driven toward the successful development of microprocessors having a clock speed of greater than 1 GHz.

In view of the trend toward high integration and high speed systems, internal circuits constituting a high-speed digital system or a clock network must be carefully designed. The internal circuits of the high-speed digital system have at least two functions. The first is a logic function for transmitting a desired output signal in response to an input signal, and the second is a memory function for storing an input signal or outputting the stored signal in synchronization with a clock signal. Flip-flops are essential components in both functions, but especially in a circuit block having the memory function.

The most basic structure of the flip-flop is a master-slave structure having two JK latches that are coupled. However, this structure cannot be applied to a high-speed digital system because of its complexity and low operation speed. In order to overcome these disadvantages of the master-slave structure, dynamic type flip-flops using a parasitic capacitance of an internal node have been developed. Unfortunately, the dynamic type flip-flop requires two or more clock signals and is very sensitive to a racing problem generated by skew between the clock signals. In order to overcome these disadvantages of the dynamic type flip-flop, true single phase clocking (TSPC) D flip-flips have been proposed. The TSPC D flip-flop uses only one clock signal that is not absolutely inverted, and offers advantages such as a small area for clock lines, a reduced clock skew, and high speed operation. One example of the TSPC D flip-flop is disclosed in U.S. Pat. No. 6,060,927 entitled "HIGH-SPEED D FLIP-FLOP", the content of which is incorporated herein by reference, in their entirety.

FIG. 1A is a circuit diagram of the TSPC D flip-flop illustrated in U.S. Pat. No. 6,060,927 and shows a technology to achieve a low power consumption and a high-speed response caused by an internal capacitance reduction. A flip-flop shown in FIG. 1A includes first to third latches. The first latch receives a clock signal CLK and a data signal D to generate a first output signal Q1'. The second latch receives the first output signal Q1' and the clock signal CLK to generate a second output signal Q1". The third latch receives the second output signal Q1" and the clock signal CLK to generate a third output signal/Q1. The inverter 17 receives the third output signal/Q1 to generate a data signal Q1 at a rising or falling edge of the clock signal CLK. Preferably, the first and second latches are ratioed latches having serially coupled pull-up and pull-down elements. Preferably, the third latch is a clock operated latch.

Since static current always flows to the ratioed latch, the ratioed latch consumes a considerable amount of current. Also, since the voltage at each connecting node of the pull-up and pull-down elements does not fully swing, the ratioed latch is very sensitive to noise. Therefore, it is very difficult to design the ratioed latch. That is, in the ratioed latch, the pull-up elements must be designed to be 7–8 times larger than the pull-down elements.

Another example of the TSPC D flip-flop is disclosed in U.S. Pat. No. 5,592,114 entitled "TRUE TYPE SINGLE-PHASE SHIFT CIRCUIT", the content of which is incorporated herein by reference, in its entirety. FIG. 1B is a circuit diagram of the TSPC D flip-flop illustrated in the U.S. Pat. No. 5,592,114. A TSPC D flip-flop shown in FIG. 1B is a positive edge-triggered D flip-flop including four PMOS transistors MP0, MP1, MP2, and MP3, and five NMOS transistors MN0, MN1, MN2, MN3, and MN4. A gate of the PMOS transistor MP0 and a gate of the NMOS transistor MN0 are connected to a data signal D. Gates of the PMOS transistors MP1 and MP2 and gates of the NMOS transistors MN2 and MN3 are connected to a clock signal CLK. A drain of the PMOS transistor MP3 and a drain of the NMOS transistor MN3 are connected to an output terminal Qb. A gate of the NMOS transistor MN1 is connected to an A node, i.e., a common drain node A to which a drain of the PMOS transistor MN1 and a drain of the NMOS transistor MN0 are commonly connected. A gate of the PMOS transistor MP3 and a gate of the NMOS transistor MN4 are connected to a B node, i.e., a common drain node B to which a drain of he PMOS transistor MP2 and a drain of the NMOS transistor MN1 are commonly connected.

When the clock signal CLK is low (e.g., ground voltage) and a data signal D is low, the potential of the A node is made low or high (e.g., power supply voltage Vcc) according to the data signal D. Meanwhile, when the clock signal CLK is low and the data signal D is high, the potential of the A node is made low. In this case, the B node is precharged to a high level. When the B node is precharged, an output terminal Qb is to latch a previous output value. Therefore, the B node maintains the previous output value. When the clock signal CLK has a low-to-high transition, a potential of the B node is to be held at a previously precharged level or is to be made low. Therefore, a potential of the output terminal Qb is to be made low or high.

Limitations of the TSPC D flip-flop shown in FIG. 1B will now be described. The first limitation is that the flip-flop is very sensitive to a clock slope (rising or falling time of a clock signal). This will be explained in detail below. FIG. 2 shows output waveforms obtained when a clock slope is maintained at 0.3 ns in a clock frequency of 100 MHz. In FIG. 2, the region of the output terminal signal Qb enclosed in a dashed circle is ideally a period that must be maintained high. Nonetheless, the voltage level of the output terminal Qb is unstably maintained during this period.

This unstable period arises because the moment the data signal D is low and the clock signal CLK transitions high to low, charges of the output terminal Qb are discharged. That is, if the slope of the clock signal CLK is not quite vertical, there is a period where the NMOS transistors MN3 and MN4 are transitorily turned on at the same time. This allows the charges of the output terminal Qb to be discharged through the NMOS transistors MN3 and MN4. More specifically, when the potential of the B node transitions low to high and the clock signal transitions high to low, there is a period where the high levels overlap each other, as shown in FIG. 3. This allows the NMOS transistors MN3 and MN4 to be turned on at the same time. Consequently, the charges of the output terminal Qb are discharged through the turned-on transistors MN3 and MN4. The gentler the clock slope becomes, the more the overlap periods of the high level increase. In a worst case scenario, erroneous data may be transmitted. As a result, the TSPC D flip-flop shown in FIG. 1B is very sensitive to the clock slope.

A second limitation associated with the TSPC D flip-flop shown in FIG. 1B is that a glitch can occur. Whenever the data signal D is maintained low and the clock signal CLK transitions low to high, the glitch occurs in the output signal Qb, as illustrated in the region enclosed by the dotted line in FIG. 4. Ideally, the output signal Qb must be continuously maintained high while the data signal D is maintained low. However, when the clock signal CLK transitions high to low and the potential of the B node transitions high to low, a glitch phenomenon occurs where the output signal Qb is transitorily discharged and then recharged, as shown in FIG. 5. The glitch phenomenon occurs because the NMOS transistors MN3 and MN4 are transitorily turned on at the same time. Further, the glitch phenomenon causes the logic block of the next stage to consume additional power.

An approach for overcoming the aforementioned glitch phenomenon is disclosed by Q. Huang, "Speed Optimization Of Edge-Triggered CMOS Circuits For Gigahertz Single-Phase Clocks", IEEE Journal of Solid-State Circuits (Vol. 31, No. 3, pp. 456–465, March, 1996). However, this approach requires as many as 12 transistors, and therefore does not led itself well to high integration.

A third limitation is that the flip-flop shown in FIG. 1B has an asymmetric propagation delay time. Ideally, the TSPC D flip-flop is to have equivalent high-to-low and low-to-high propagation delay times, for advantageous power consumption and speed of the TSPC D flip-flop. In the case where the output signal Qb transitions high to low, the TSPC D flip-flop operates at very high speed; whereas, in the case where the output signal Qb transitions low to high, the TSPC D flip-flop operates at very low speed. That is, as the B node is discharged to low level, the output signal Qb is charged to high level, as shown in FIG. 6B. Such a path is more complex, as compared to a transition path of FIG. 6A. Therefore, the TSPC D flip-flop of FIG. 1B has different high-to-low and low-to-high propagation delay times. Solid lines of FIG. 6A and FIG. 6B represent signal transmission paths, respectively.

In conclusion, the TSPC D flip-flops described above are limited in that they are sensitive to the slope of a clock signal, and in that a glitch phenomenon is generated. Thus, there is a demand for a TSPC D flip-flop of a novel structure that prevents the output signal from being transitorily discharged at an undesirable time.

SUMMARY OF THE INVENTION

A first feature of the present invention is to provide a high-speed D flip-flop that prevents an output signal from being transitorily discharged at an undesirable time.

Another feature of the present invention is to provide a high-speed D flip-flop that prevents a glitch phenomenon in the output signal.

Still another feature of the present invention is to provide a high-speed D flip-flop that reduces setup time.

Still another feature of the present invention is to provide a high-speed D flip-flop that secures equivalent low-to-high and high-to-low transition times of the output signal.

In order to achieve these features, the present invention provides a high-speed discharge-suppressed D flip-flop as a data storage device. The flip-flop includes first to third nodes and a first precharge means for precharging the first and second nodes to a first supply voltage in response to a clock signal. The first switching means provides a first discharge path between the first and third nodes in response to an input signal. The second switching means provides a second discharge path between the second and third nodes in response to a potential of the first node. The second precharge means precharges an output terminal to the first supply voltage in response to a potential of the second node. The third switching means provides a third discharge path between the output terminal and the third node in response to the potential of the second node. The fourth switching means connects the first to third discharge paths to a second supply voltage in response to the clock signal. The first supply voltage is a power supply voltage, and the second supply voltage is a ground voltage.

In this embodiment, the precharge means optionally includes a first PMOS transistor that is coupled between the first supply voltage and the first node and is turned on/off according to the clock signal, and a second PMOS transistor that is coupled between the first supply voltage and the second node and is turned on/off according to the clock signal.

In this embodiment, the first switching means optionally includes an NMOS transistor having a current path formed between the first and third nodes and a gate connected to receive the input signal.

In this embodiment, the second switching means optionally includes an NMOS transistor having a current path formed between the second and third nodes and a gate coupled to the first node.

In this embodiment, the second precharge means optionally includes a PMOS transistor having a current path formed between the first supply voltage and the output terminal and a gate coupled to the second node.

In this embodiment, the third switching means optionally includes first and second NMOS transistors whose current paths are serially formed between the output terminal and the third node. Gates of the current paths are connected to the clock signal and the second node, respectively.

In this embodiment, the fourth switching means optionally includes an NMOS transistor having a current path formed between the third node and the second supply voltage and a gate coupled to receive the clock signal.

According to another aspect of the invention, a D flip-flop synchronized with a single clock signal to store an input signal includes a first input terminal, a second terminal for receiving a clock signal, an output terminal for outputting an output signal, a first power terminal for receiving a power supply voltage, and a second power terminal for receiving a ground voltage. A first charge supply means is coupled between the first power terminal and a first internal node and operates in synchronization with the clock signal. A second charge supply means is coupled between the first power terminal and a second internal node and operates in synchronization with the clock signal. A third charge supply means is coupled between the first power terminal and the output terminal and operates in synchronization with a potential of the second internal node. A first charge discharging means is coupled between the first and third internal nodes and operates in synchronization with the input signal. A second charge discharging means is coupled between the second and third internal nodes and operates in synchronization with a potential of the first internal node. A third charge discharging means is coupled between the output terminal and the third internal node and operates in synchronization with the clock signal. A charge discharging path supply means connects at least one of the first to third charge discharging means to the second power terminal.

According to still another aspect of the invention, a D flip-flop includes a first power terminal for receiving a power supply voltage, a second power terminal that receives a ground voltage, a first transistor, for example a MOS transistor, of a first conductive type that is coupled between the first power terminal and the first internal node and operates in synchronization with a clock signal, a second transistor of the first conductive type that is coupled between the first power terminal and the second internal node and operates in synchronization with the clock signal, a third transistor of the first conductive type that is coupled between the first power terminal and an output terminal and operates in response to a potential of the second internal node, a first transistor that is coupled between the first and third internal nodes and operates in response to an input signal, a second transistor of the second conductive type that is coupled between the second and third internal nodes and operates in synchronization with the potential of the first internal node, third and fourth transistors of the second conductive type that are serially coupled between the output terminal and the third internal node, a fifth transistor of the second conductive type that is coupled between the third internal node and the second power terminal and operates in response to the clock signal. The third transistor of the second conductive type operates in response to the clock signal, and the fourth transistor of the second conductive type operates in response to the potential of the second internal node.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. However, it will be understood to those skilled in the art that the present invention may be practiced without these specific details.

Figure 7:
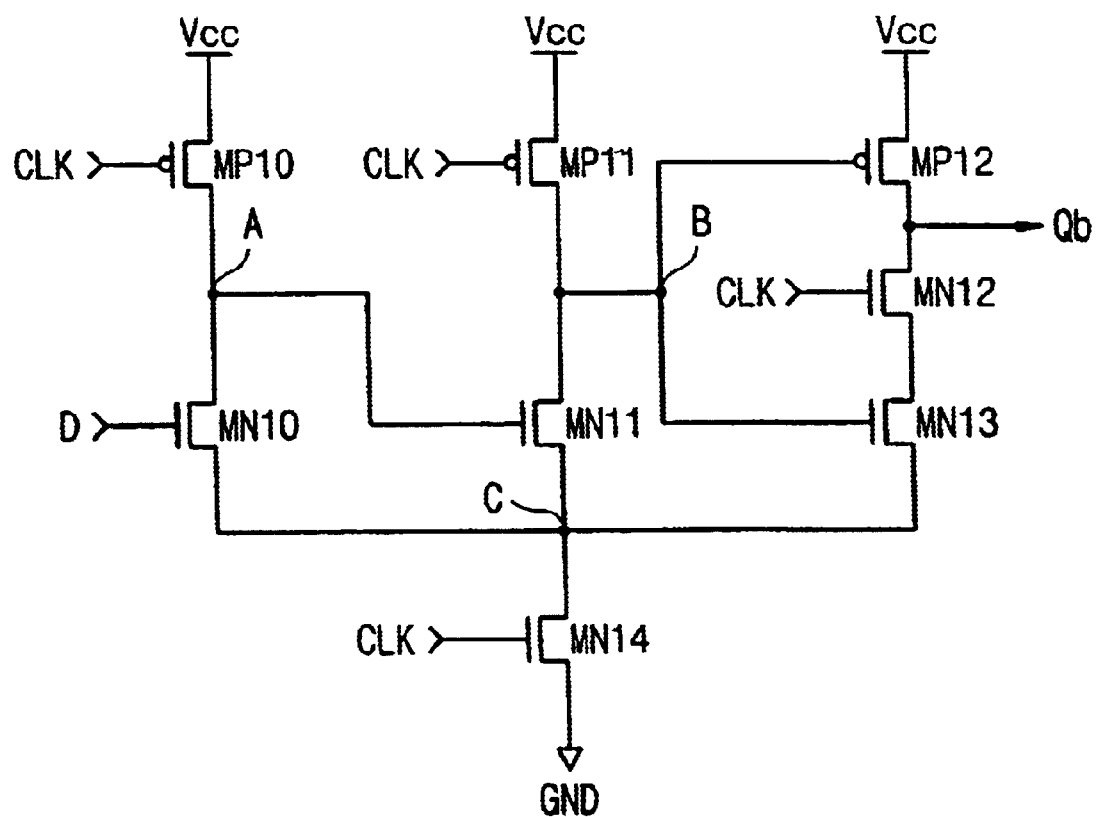
FIG. 7 is a circuit diagram of a D flip-flop according to the present invention.

Referring to FIG. 7, a high-speed D flip-flop according to an embodiment of the present invention includes three PMOS transistors MP10, MP11, and MP12 and five NMOS transistors MN10, MN11, MN12, MN13, and MN14. A gate of the PMOS transistor MP10 is coupled to receive a clock signal CLK, a gate of the NMOS transistor MN10 is coupled to receive a data signal D. A source of the PMOS transistor MP10 is coupled to a power supply voltage Vcc, and a drain thereof is coupled to an A node. A drain of the NMOS transistor MN10 is coupled to the A node, i.e., the drain of the PMOS transistor MP10, and a source thereof is coupled to a C node, i.e., a drain of the NMOS transistor MN14. A gate of the NMOS transistor MN14 is coupled to receive the clock signal CLK, and a source thereof is grounded.

A gate of the PMOS transistor MP11 is coupled to receive the clock signal CLK, a source thereof is coupled to the power supply voltage Vcc, and a drain thereof is coupled to the B node. The NMOS transistor MN11 has a gate coupled to the A node, a drain coupled to the B node, and a source coupled to the C node. The PMOS transistor MP12 whose gate is coupled to the B node, has a source coupled to the power supply voltage Vcc and a drain coupled to an output terminal Qb. A gate of the NMOS transistor MN12 is coupled to receive the clock signal CLK and a drain thereof is coupled to the output terminal Qb. The NMOS transistor MN12 whose gate is coupled to the B node has a drain coupled to a source of the NMOS transistor MN12 and a source coupled to the C node.

Figure 8:
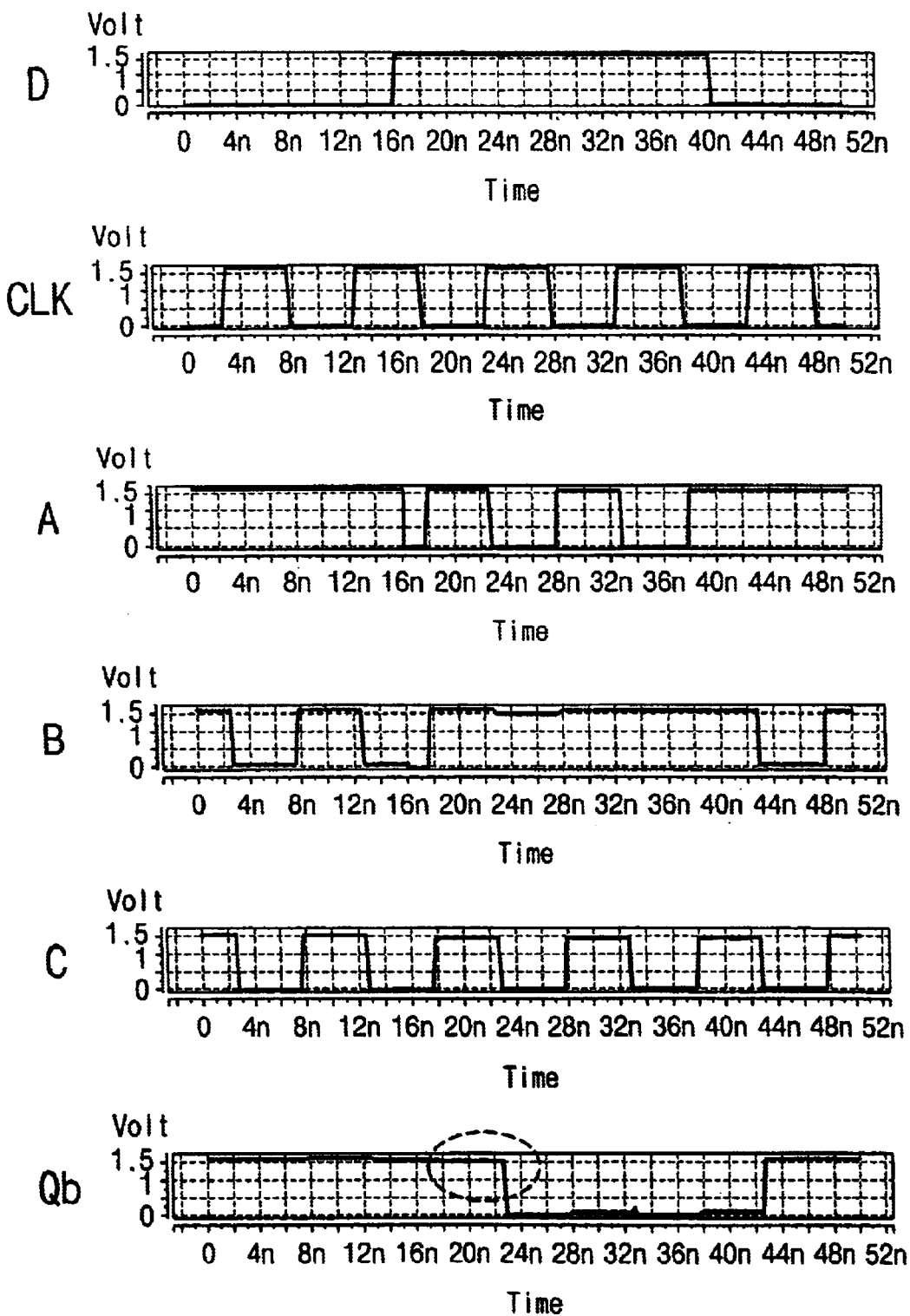
FIG. 8 and FIG. 9 are timing diagrams showing output waveforms of the D flip-flop shown in FIG. 7.

When the clock signal CLK is low, the A and B nodes are precharged high through their corresponding PMOS transistors MP10 and MP11 irrespective of the data signal D. Since the NMOS transistor MN14 is turned off, the C node is also precharged high. When the clock signal CLK is high, the potential of the respective nodes A, B, and Qb is to be determined by the data signal D. For example, when the clock signal CLK is high and the data signal D is low, the A node is maintained at a previously precharged state. At this time, since a precharged voltage at the B node is discharged through the NMOS transistors MN11 and MN14, the output terminal Qb is charged up to a high level of the power supply voltage Vcc. That is, the output signal Qb is made high, as shown in FIG. 8. On the other hand, when the clock signal is high and the data signal transitions low to high, the precharged voltage at the A node is discharged through the NMOS transistors MN10 and MN14. This enables a precharged voltage at the B node to be maintained in its current state. As a result, the output terminal Qb is grounded through the NMOS transistors MN12, MN13, and MN14. That is, the output signal Qb is made low, as shown in FIG. 8.

As shown in FIG. 7, the high-speed D flip-flop of this invention has only one discharge path. The discharge path is formed through the NMOS transistor MN14 that is turned on/off according to the clock signal CLK. Such a circuit construction may prevent the output signal Qb from being discharged at an unwanted time. In other words, immunity from the clock slope is enhanced and the glitch phenomenon is suppressed, as compared to the conventional configuration. This will be described more fully below.

As described above, in the conventional configuration, because of the sensitivity to the slope of the clock signal, an erroneous data transfer problem and a glitch problem results from the discharge of the output signal Qb at an undesired time. These problems are solved in the present invention by suppressing the discharge of the output signal Qb at that time. Basically, an output operation of the output signal Qb is performed through NMOS transistors MN12, MN13, and MN14 that are serially coupled between the output terminal Qb and the ground voltage GND. After the drain of the NMOS transistor, i.e., the C node, becomes completely discharged, the output terminal Qb may then be discharged. Since a constant amount of charge is always supplied at the C node at the time when an unwanted discharge would otherwise have occurred, the charge at the C node must be first discharged in order to discharge the charge of an output node. As much as the time required for discharging the charge at the C node, the unwanted discharge of the output terminal Qb is transitorily suppressed. In this manner, the present invention addresses the limitations of the conventional embodiment, including sensitivity to the clock slope and the glitch phenomenon. In view of the above, the high-speed flip-flop of the present invention may be referred to as a discharge-suppressed D flip-flop.

Figure 1A:
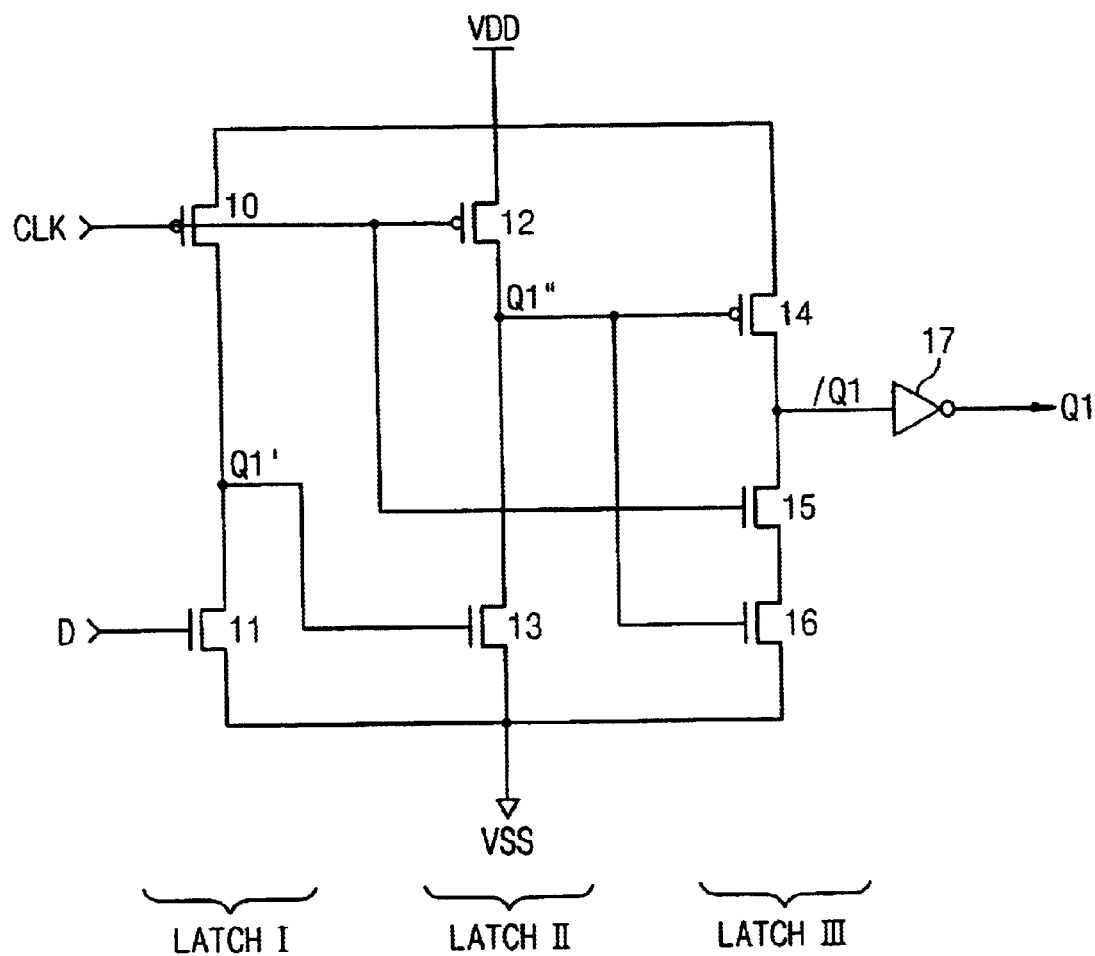
FIG. 1A and FIG. 1B are circuit diagrams of a conventional D flip-flop.
Figure 1B:
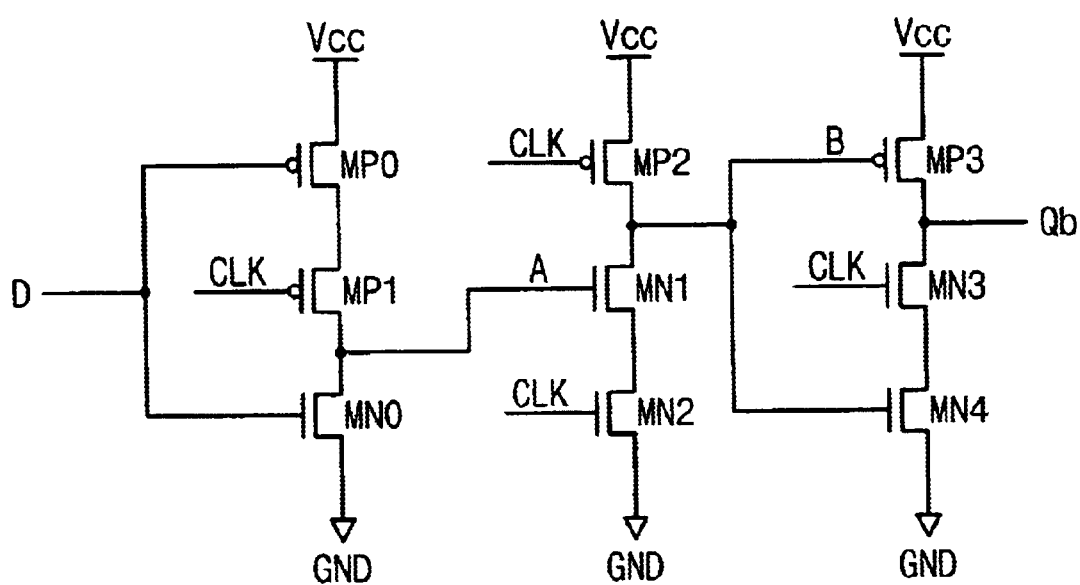
Figure 2:
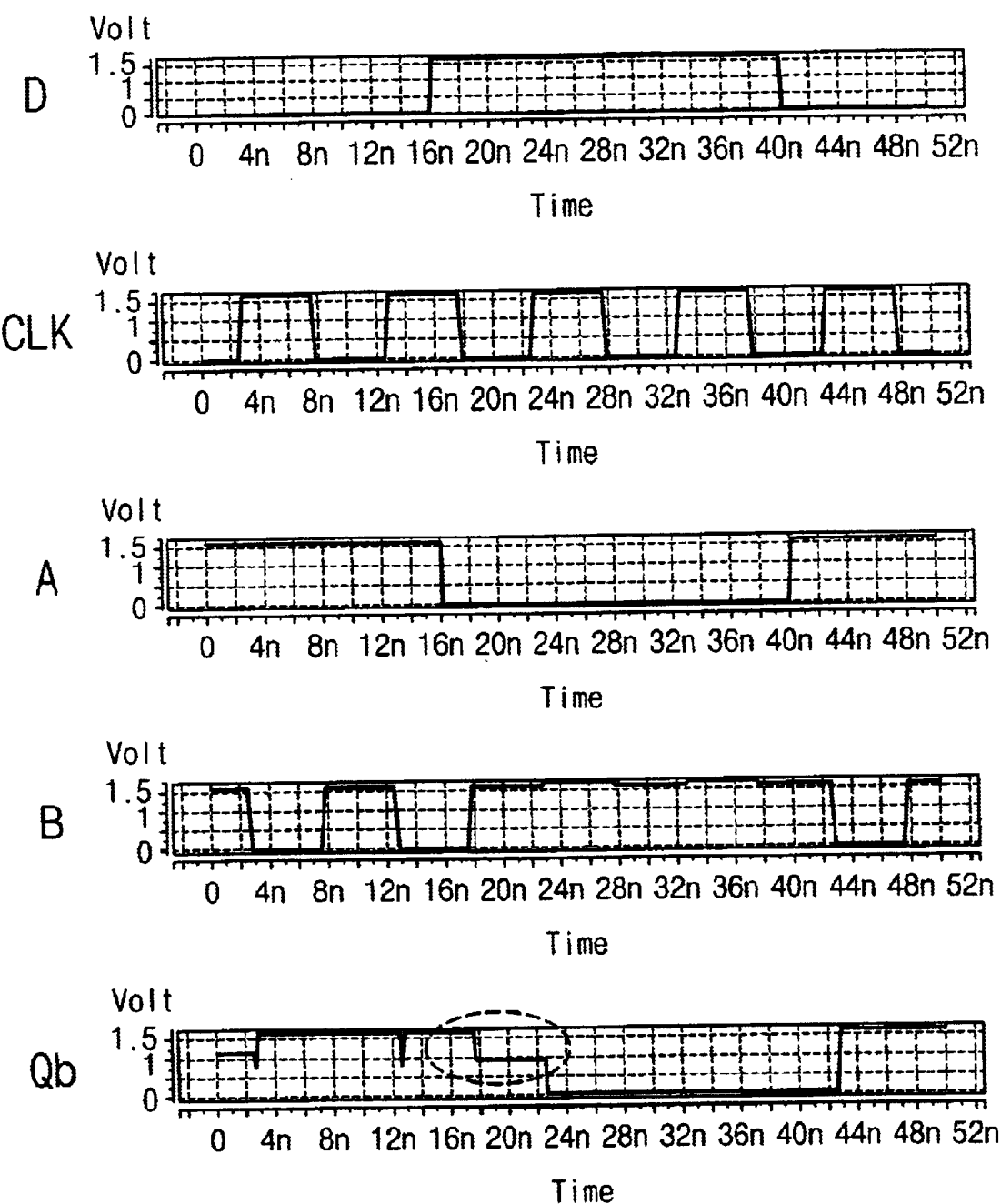
FIG. 2 is a timing diagram showing waveforms of the D flip-flop shown in FIG. 1B.
Figure 3:
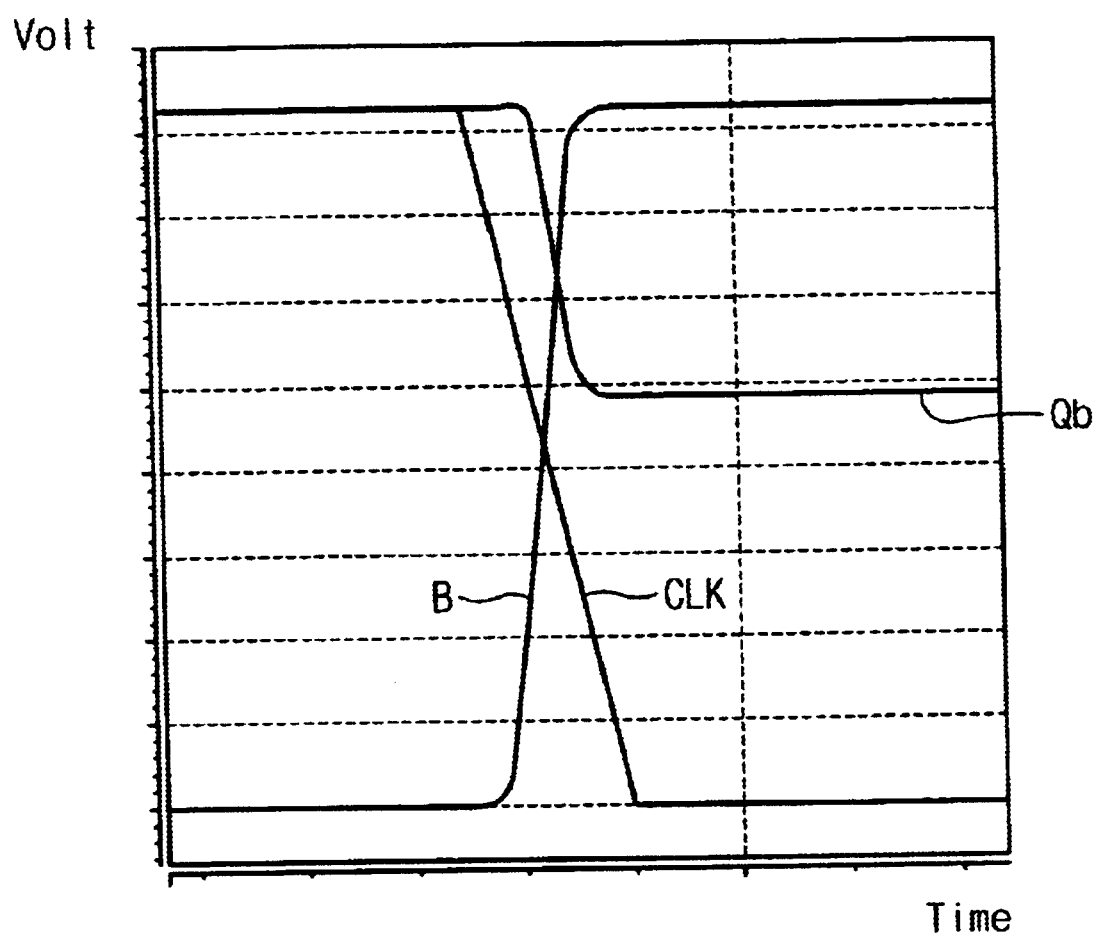
FIG. 3 is a graph for explaining sensitivity to clock slope for the D flip-flop shown in FIG. 1B.
Figure 4:
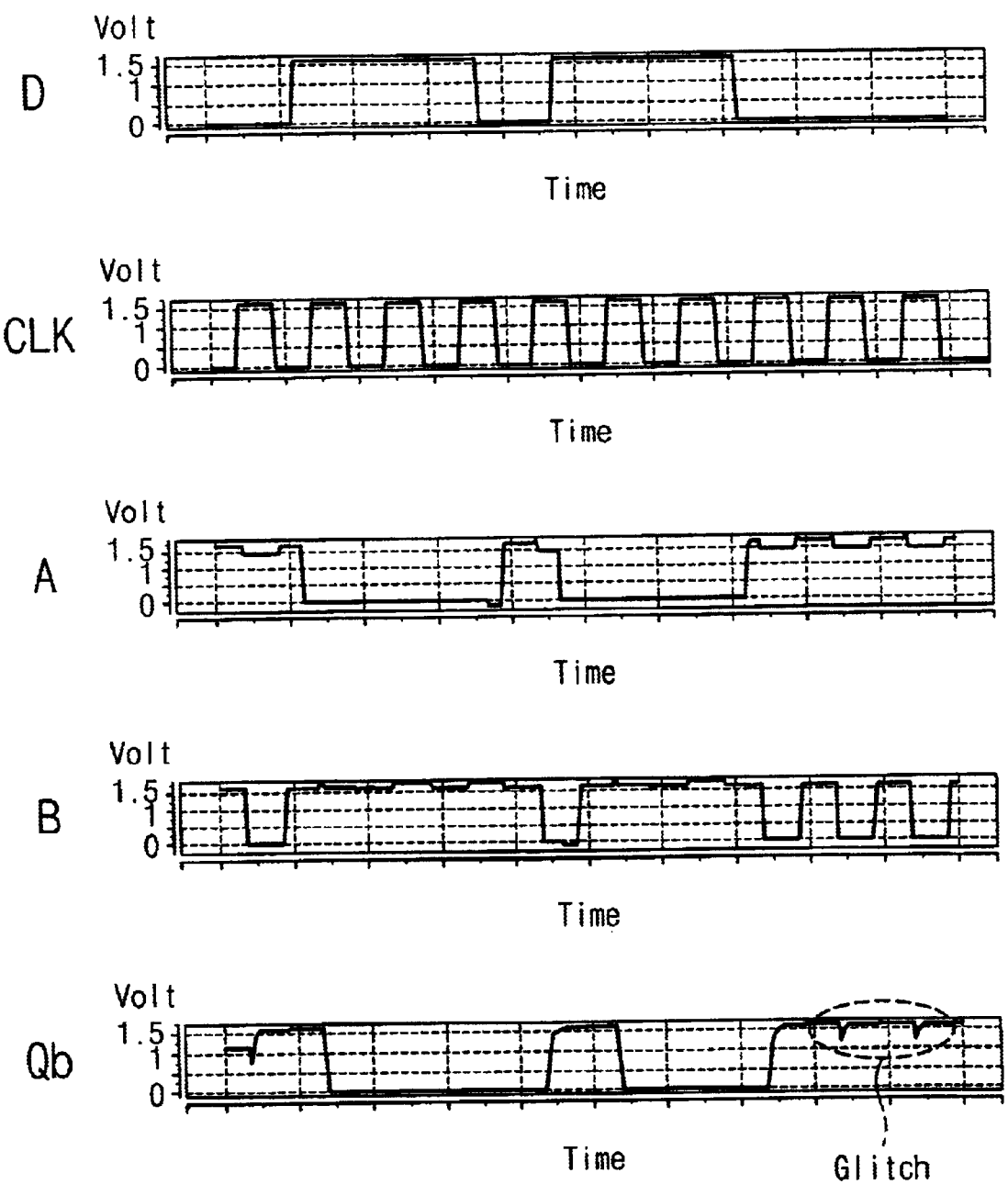
FIG. 4 is a timing diagram showing additional waveforms of the D flip-flop shown in FIG. 1B.
Figure 5:
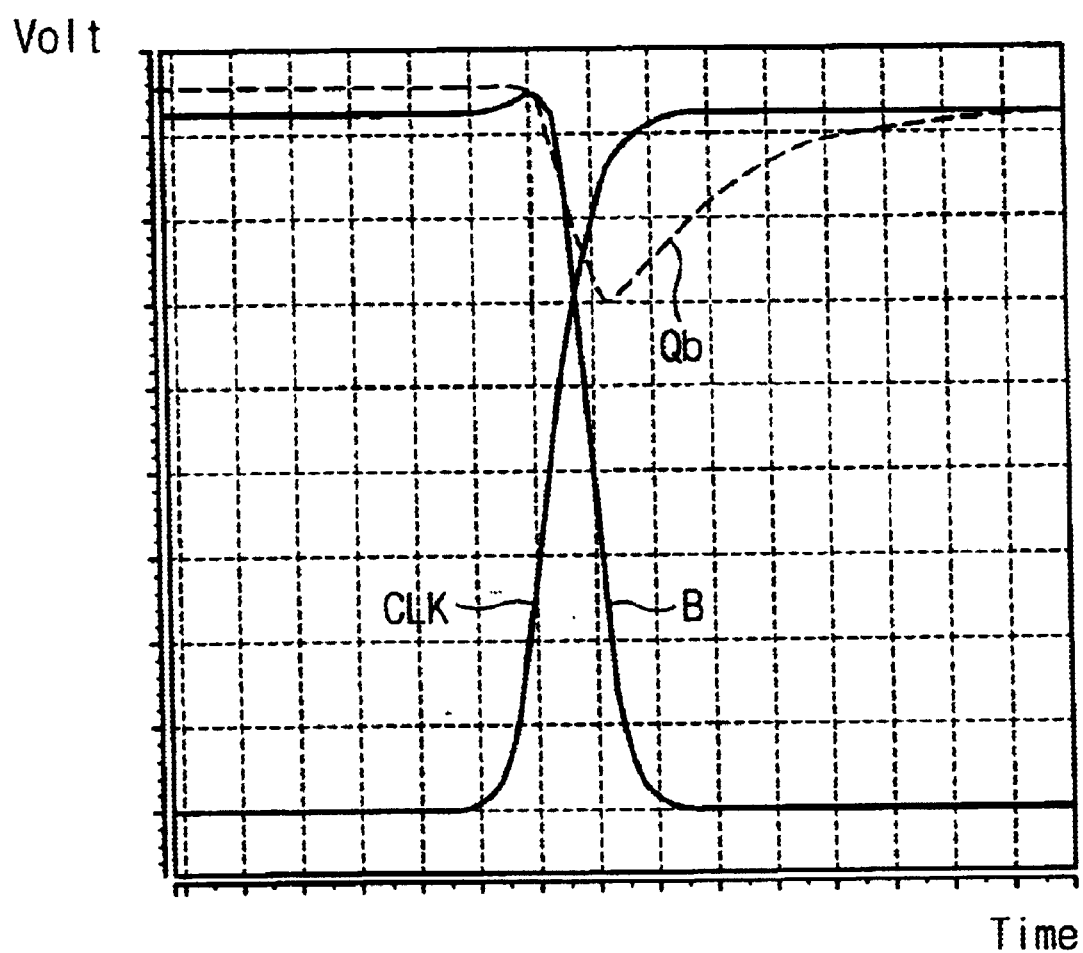
FIG. 5 is a graph for explaining a glitch phenomenon in the D flip-flop shown in FIG. 1B.
Figure 6A:
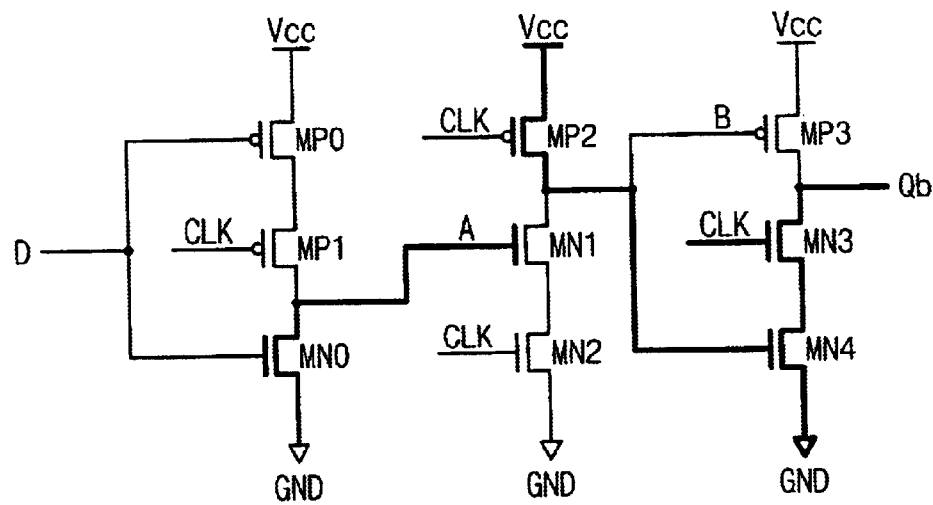
FIG. 6A and FIG. 6B are circuit diagrams showing a high-to-low transition path and a low-to-high transition path of an output signal for the D flip-flop shown in FIG. 1B.
Figure 6B:
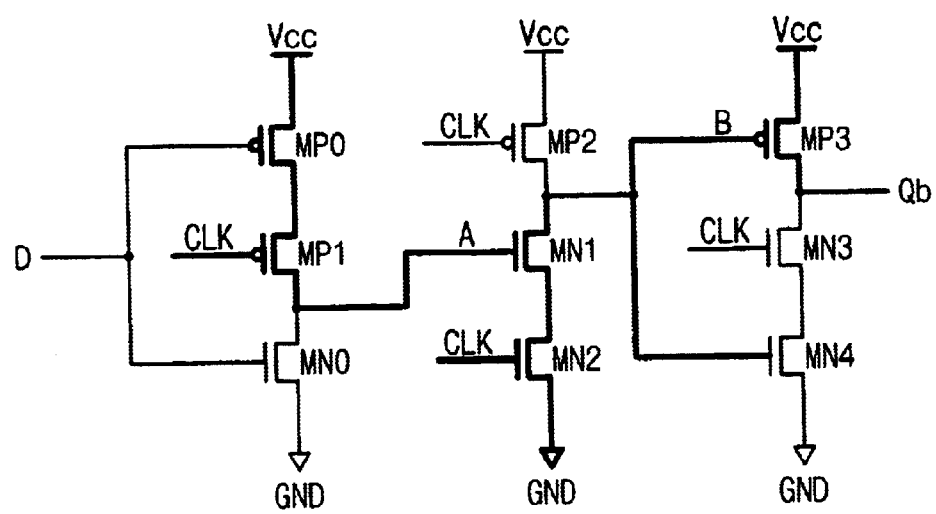
Figure 9:
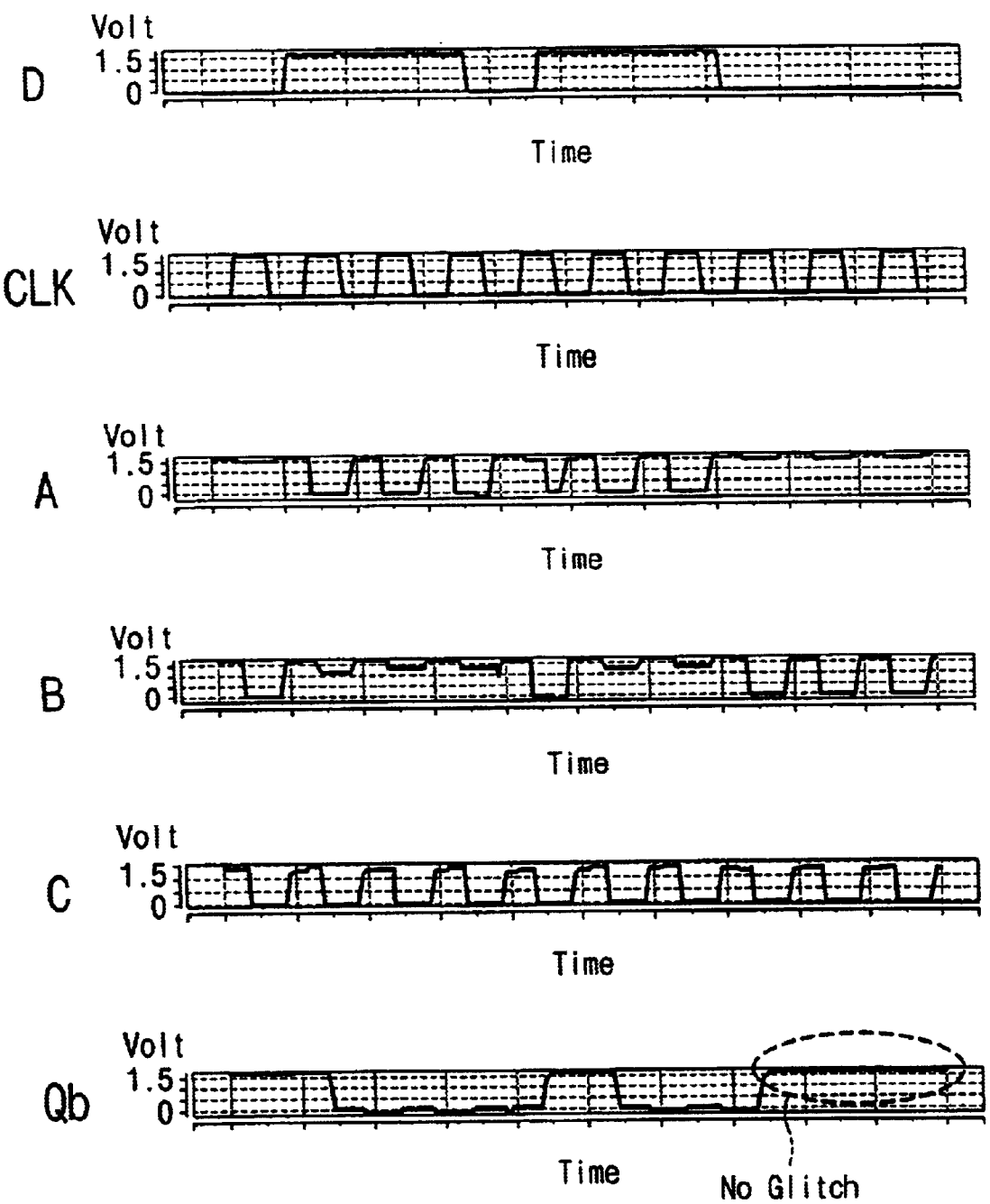
Figure 10:
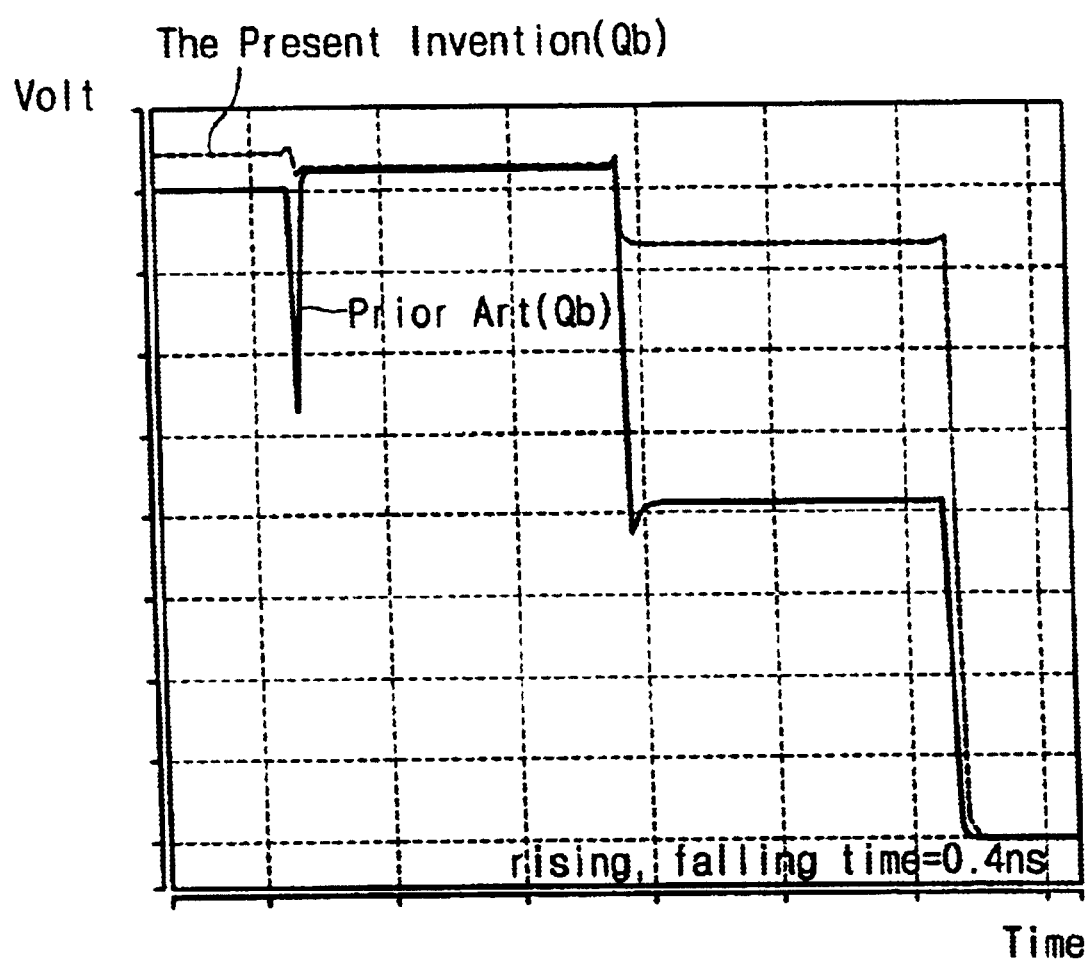
FIG. 10 is a graph for explaining an improved characteristic of the flip-flop of the present invention, as compared to the prior art.

In the region of FIG. 8 encircled in a dashed line, the above described transitory phenomenon that occurs in the conventional configuration when the data signal D is low and the clock signal CLK transitions high to low does not occur in the present invention (refer comparatively to FIG. 2). In addition, the glitch phenomenon that occurs in the conventional configuration when the data signal D is low and the clock signal transitions low to high does not occur in the embodiment of the present invention, as shown in the comparative charts of FIG. 4 and FIG. 9. In summary, as shown in the comparative chart of FIG. 10, the glitch phenomenon of a D flip-flop and a sensitivity to a clock signal during the high-to-low transition of the Qb signal are remarkably reduced in the present invention, as compared to the prior art. That is, immunity from clock slope is greatly enhanced.

Figure 11A:
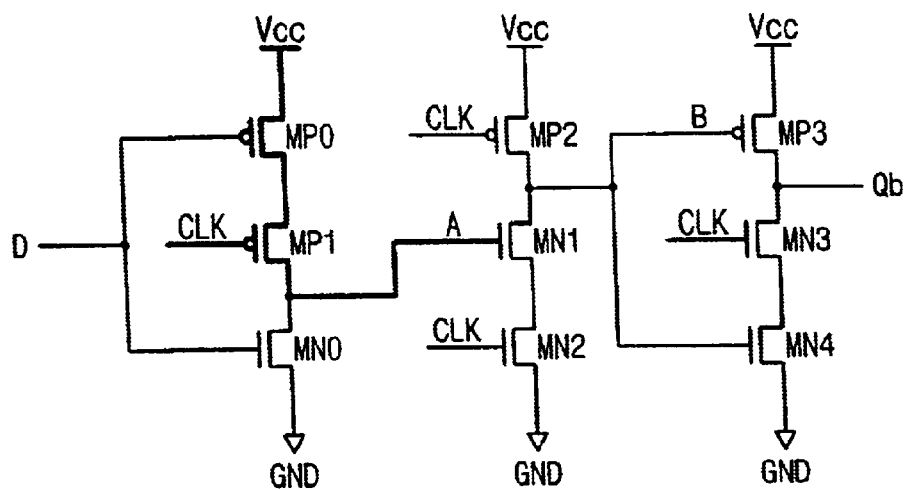
FIG. 11A and FIG. 11B are circuit diagrams for explaining setup times of the flip flops of the present invention and the prior art.
Figure 11B:
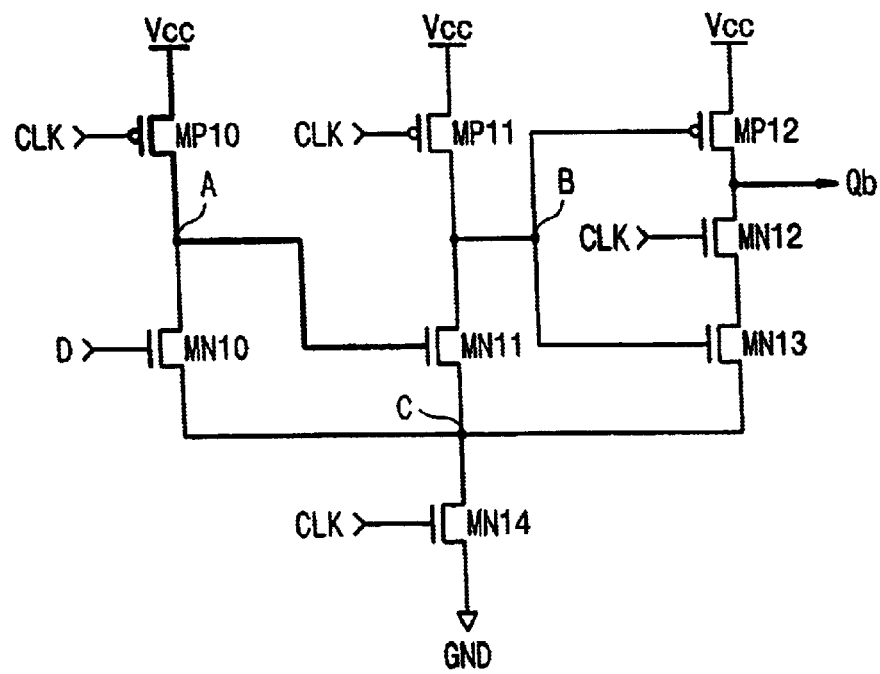

Furthermore, the D flip-flop configured according to the present invention has a relatively shorter setup time, as compared to a prior art. The setup time refers to the time required for charging the A node to a high level, as shown in FIG. 11A and FIG. 11B. In case of FIG. 11A, showing a TSPC D flip-flop according to the conventional configuration, the A node is charged to a high level through two PMOS transistors MP0 and MP1. In case of FIG. 11B showing a TSPC D flip-flop according to the invention, the A node is charged to a high level through only one PMOS transistor MP10. Therefore, the D flip-flop configured according to the present invention has a shorter setup time than the D flip-flop according to the conventional configuration.

The following Table 1 tabulates setup time, propagation delay time, and total delay time of a flip-flop according to the conventional configuration.

TABLE 1

| Qb | Time | | |
|---|---|---|---|
| | Setup time (Tsu) | propagation delay time (Tp) | total delay time (Ttot) |
| L–H transition | −0.00425 ns | 0.02781 ns | 0.02356 ns |
| H–L transition | 0.03364 ns | 0.06154 ns | 0.09518 ns |

The following Table 2 tabulates setup time, propagation delay time, and total delay time of a flip-flop according to the present invention.

TABLE 2

| Qb | Time | | |
|---|---|---|---|
| | setup time (Tsu) | propagation delay time (Tp) | total delay time (Ttot) |
| L–H transition | −0.00394 ns | 0.04285 ns | 0.03891 ns |
| H–L transition | 0.01724 ns | 0.04828 ns | 0.06552 ns |

As shown in Table 1, the low-to-high transition time (0.02781 ns) of output signal Qb is very asymmetrical to the high-to-low transition time (0.06154 ns) thereof. As shown in Table 2, the high-to-low transition time (0.04285 ns) of output signal Qb is substantially symmetrical to the low-to-high transition thereof. As a result, a total delay time is reduced to achieve a speed enhancement of about 30%. The speed enhancement results from a boosting operation of the output signal Qb. The boosting operation of the output signal Qb is achieved when the output signal Qb transitions low to high, and charged charges at a C node serve to boost the output signal Qb to high. That is, during an early period when the output signal Qb transitions low to high, the NMOS transistors MN12 and MN13 are turned on to pass the charges at the C node to an output terminal. Thus, the voltage of the output terminal is increased. In comparison, in the construction of the conventional D flip-flop, if the NMOS transistors MN3 and MN4 are turned on during an early period, the voltage of the output terminal Qb is discharged, to lower operation speed. This is similar to the glitch phenomenon. As a result, since the low-to-high transition time of the D flip-flop according to the present invention is shortened while an output signal is inverted through three NMOS transistors, the high-to-low transition time thereof is increased. This increase, however, does not have an influence on the flip-flop operation speed and may be negligible.

The following Table 3 shows characteristics of flip-flops according to the conventional configuration and the present invention.

TABLE 3

| | Prior Art | Present Invention |
|---|---|---|
| Number of Transistors | 9 | 8 |
| Total Transistor Width | 3.6 μm | 3.6 μm |
| Glitch | existence | non-existence |
| Immunity from Clock Slop | 0.2 ns | 1.0 ns |
| Propagation Delay | 0.06154 ns | 0.04828 ns |
| Setup Time | 0.03364 ns | 0.01724 ns |
| Total Delay Time | 0.09518 | 0.06552 |
| Power Consumption | 161 μW | 159 μW |
| PDP (Power Delay Product) | 15.3 fJ | 10.4 fJ |

As shown in Table 3, the setup time, the propagation delay time, and the total delay time of the D flip-flop of this embodiment of the present invention are all improved. In addition, transistors constituting the flip-flop decrease in number, so that the flip-flop is constructed in a small area and power is therefore saved. As compared to the conventional D flip-flop, the D flip-flop of the present invention has enhanced immunity from clock slope and glitch phenomenon is mitigated or eliminated.

The discharge-suppressed D flip-flop of the present invention makes it possible to accomplish a more stable and higher-speed operation by addressing problems associated with the conventional TSPC D flip-flop. Therefore, the discharge-suppressed D flip-flop of the present invention is well-suited for application in high-speed microprocessor systems, high-speed synchronous digital systems, prescalers for wired and wireless communication, and the like.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A data storage device comprising:
   a first node, a second node, and a third node;
   a first precharge means for precharging the first node and the second node to a first supply voltage in response to a clock signal;
   a first switching means for providing a first discharge path between the first node and the third node in response to an input signal;
   a second switching means for providing a second discharge path between the second node and the third node in response to a potential at the first node;
   a second precharge means for precharging an output terminal to the first supply voltage in response to a potential at the second node;
   a third switching means for providing a third discharge path between the output terminal and the third node in response to the clock signal and the potential of the second node; and
   a fourth switching means for connecting the first, second, and third discharge paths with a second supply voltage in response to the clock signal.

2. The data storage device of claim 1, wherein the first supply voltage is a power supply voltage and the second supply voltage is a ground voltage.

3. The data storage device of claim 1, wherein the first precharge means includes:
   a first PMOS transistor that is activated in response to the clock signal, the first PMOS transistor being coupled between the first supply voltage and the first node; and
   a second PMOS transistor that is activated in response to the clock signal, the second PMOS transistor being coupled between the first supply voltage and the second node.

4. The data storage device of claim 1, wherein the first switching means includes an NMOS transistor having a current path formed between the first and third nodes and a gate coupled to receive the input signal.

5. The data storage device of claim 1, wherein the second switching means includes an NMOS transistor having a current path formed between the second and third nodes and a gate coupled to the first node.

6. The data storage device of claim 1, wherein the second precharge means includes a PMOS transistor having a current path formed between the first supply voltage and the output terminal and a gate coupled to the second node.

7. The data storage device of claim 1, wherein the third switching means includes first and second NMOS transistors whose current paths are serially formed between the output terminal and the third node and whose gates are coupled to the clock signal and the second node, respectively.

8. The data storage device of claim 1, wherein the fourth switching means includes an NMOS transistor having a current path formed between the third node and the second supply voltage and a gate coupled to receive the clock signal.

9. A D flip-flop circuit for storing an input signal in synchronization with a single clock signal, comprising:
   a first input terminal for supplying an input signal;
   a second input terminal for supplying a clock signal;
   an output terminal for outputting an output signal;
   a first power terminal for receiving a power supply voltage;
   a first charge supply means operating in synchronization with the clock signal, the first charge supply means being coupled between the first power terminal and a first internal node;
   a second charge supply means operating in synchronization with the clock signal, the second charge supply means being coupled between the first power terminal and a second internal node;
   a third charge supply means operating in synchronization with a potential of the second internal node, the third charge supply means being coupled between the first power terminal and the output terminal;
   a first charge discharging means operating in synchronization with the input signal, the first charge discharging means being coupled between the first and third nodes;
   a second charge discharging means operating in synchronization with the potential of the first internal node, the second charge discharging means being coupled between the second and third nodes;
   a third charge discharging means operating in synchronization with the second internal node and the clock signal, the third charge discharging means being coupled between the output terminal and the third internal node; and
   a charge discharging path supply means for connecting at least one of the first, second and third charge discharging means with the second power terminal.

10. The D flip-flop circuit of claim 9, wherein the first charge supply means includes a PMOS transistor that is coupled between the first power terminal and the first internal node and is activated in response to the clock signal.

11. The D flip-flop circuit of claim 9, wherein the second charge supply means includes a PMOS transistor that is coupled between the first power terminal and the second internal node and is activated in response to the clock signal.

12. The D flip-flop circuit of claim 9, wherein the third charge supply means includes a PMOS transistor that is coupled between the first power terminal and the output terminal and is activated in response to the potential of the second internal node.

13. The D flip-flop circuit of claim 9, wherein the first charge discharging means includes an NMOS transistor that is coupled between the first and third internal nodes and is activated in response to the input signal.

14. The D flip-flop circuit of claim 9, wherein the second charge discharging means includes an NMOS transistor that is coupled between the second and third internal nodes and is activated in response to the potential of the first internal node.

15. The D flip-flop circuit of claim 9, wherein the third charge discharging means includes first and second NMOS transistors whose current paths are serially formed between the output terminal and the third internal node and whose gates are coupled to the clock signal and the second internal node, respectively.

16. The D flip-flop circuit of claim 9, wherein the charge discharging path supply means includes an NMOS transistor that is coupled between the third internal node and the second power terminal and activated in response to the clock signal.

17. A D flip-flop circuit comprising:
- a first power terminal for receiving a power supply voltage;
- a second power terminal for receiving a ground voltage;
- a first transistor of a first conductive type that is coupled between the first power terminal and a first internal node and operates in response to a clock signal;
- a second transistor of the first conductive type that is coupled between the first power terminal and a second internal node and operates in response to the clock signal;
- a third transistor of the first conductive type that is coupled between the first power terminal and an output terminal and operates in response to a potential of the second internal node;
- a first transistor of a second conductive type that is coupled between the first internal node and a third internal node and operates in response to an input signal;
- a second transistor of the second conductive type that is coupled between the second and third internal nodes and operates in response to a potential of the first internal node;
- third and fourth transistors of the second conductive type that are serially coupled between the output terminal and the third internal node,
- wherein the third transistor of the second conductive type operates in response to the clock signal, and wherein the fourth transistor of the second conductive type operates in response to the potential of the second internal node; and
- a fifth transistor of the second conductive type that is coupled between the third internal node and the second power terminal and operates in response to the clock signal.

18. The D flip-flop circuit of claim 17, wherein each of the first, second and third transistors of the first conductive type includes a PMOS transistor.

19. The D flip-flop circuit of claim 17, wherein each of the first, second, third, fourth and fifth transistors of the second conductive type includes an NMOS transistor.

* * * * *